(12) United States Patent
Yoshikawa et al.

(10) Patent No.: US 7,800,433 B2
(45) Date of Patent: Sep. 21, 2010

(54) POWER SUPPLY SWITCHING CIRCUIT

(75) Inventors: Kiyoshi Yoshikawa, Chiba (JP);
Fumiyasu Utsunomiya, Chiba (JP);
Toshiyuki Tsuzaki, Chiba (JP);
Hiroyuki Masuko, Chiba (JP); Osamu Uehara, Chiba (JP); Hiroki Wake, Chiba (JP); Michiyasu Deguchi, Chiba (JP)

(73) Assignee: Seiko Instruments Inc., Chiba (JP)

( * ) Notice: Subject to any disclaimer, the term of this patent is extended or adjusted under 35 U.S.C. 154(b) by 133 days.

(21) Appl. No.: 12/342,232

(22) Filed: Dec. 23, 2008

(65) Prior Publication Data

US 2009/0167410 A1 Jul. 2, 2009

(30) Foreign Application Priority Data

Dec. 27, 2007 (JP) ............................. 2007-335808

(51) Int. Cl.
*H02M 1/10* (2006.01)
(52) U.S. Cl. ....................... 327/547; 327/530
(58) Field of Classification Search ................ 327/530, 327/547
See application file for complete search history.

(56) References Cited

U.S. PATENT DOCUMENTS

| | | | | |
|---|---|---|---|---|
| 5,306,961 A | * | 4/1994 | Leo | 327/530 |
| 5,886,561 A | * | 3/1999 | Eitan et al. | 327/408 |
| 5,910,750 A | * | 6/1999 | Harada et al. | 327/544 |
| 6,492,863 B2 | * | 12/2002 | Kono et al. | 327/538 |
| 6,525,599 B2 | * | 2/2003 | Nguyen et al. | 327/544 |
| 6,771,117 B2 | * | 8/2004 | Nakai | 327/541 |
| 7,282,984 B2 | * | 10/2007 | Kim et al. | 327/530 |
| 7,535,284 B2 | * | 5/2009 | Ito | 327/538 |

FOREIGN PATENT DOCUMENTS

JP 2006-254672 9/2006

* cited by examiner

*Primary Examiner*—Hai L Nguyen
(74) *Attorney, Agent, or Firm*—Brinks Hofer Gilson & Lione

(57) ABSTRACT

Provided is a power supply switching circuit capable of efficiently supplying a desired voltage among a plurality of voltages to a load. In the case of a P-type semiconductor substrate, N-type MOS transistors are provided between a load and an AC adapter and between the load and a battery, and hence no parasitic diode exists between the load and the AC adapter or the battery, resulting in no current path due to the parasitic diode. Thus, when the AC adapter and the battery are connected to the power supply switching circuit, the N-type MOS transistor is turned off, whereby the current path between the battery and the load is cut off completely and the N-type MOS transistor is turned on. Accordingly, the battery cannot supply a voltage to the load while only the AC adapter can supply a voltage to the load.

4 Claims, 2 Drawing Sheets

POWER SUPPLY SWITCHING CIRCUIT

RELATED APPLICATIONS

This application claims priority under 35 U.S.C. § 119 to Japanese Patent Application No. JP2007-335808 filed on Dec. 27, 2007, the entire content of which is hereby incorporated by reference.

BACKGROUND OF THE INVENTION

1. Field of the Invention

The present invention relates to a power supply switching circuit for switching power supply voltages to be supplied to a load.

2. Description of the Related Art

Portable electronic devices and the like are designed to operate with a plurality of power supplies like an AC adapter and a battery. In general, a voltage of the AC adapter is higher than a voltage of the battery. When the AC adapter is connected to a rechargeable electronic device, a power supply voltage is supplied from the AC adapter to a load. In this case, a rectifier diode disposed between the power supply and the load prevents a current from flowing from the AC adapter to the battery.

However, the above-mentioned circuit may cause a power loss because the voltage supplied from the battery to the load is dropped by a forward voltage drop of the rectifier diode.

In order to solve the problem described above, a power supply switching circuit illustrated in FIG. 4 is proposed. The power supply switching circuit of FIG. 4 includes a P-type MOS transistor instead of the rectifier diode. More specifically, a P-type MOS transistor M1 is disposed between an AC adapter 23 and a load 28, and a P-type MOS transistor M2 is disposed between a battery 20 and the load 28 (see, for example, Japanese Patent Application Laid-open No. 2006-254672).

However, the conventional power supply switching circuit illustrated in FIG. 4 has a problem that if a semiconductor substrate is of P type, a higher voltage between a voltage of the AC adapter 23 and a voltage of the battery 20 may be supplied to the load 28 because of a parasitic diode existing in the P-type MOS transistor.

SUMMARY OF THE INVENTION

The present invention has been made in view of the above-mentioned problem, and it is an object thereof to provide a power supply switching circuit capable of effectively supplying a desired voltage among a plurality of voltages to a load.

In order to solve the above-mentioned problem, the present invention provides a power supply switching circuit including: a first power source terminal to which a first power supply is connected; a second power source terminal to which a second power supply is connected; a first MOS transistor of a second conductive type which is formed on a semiconductor substrate of a first conductive type, and includes a drain connected to the first power source terminal and a source connected to a load terminal; a second MOS transistor of the second conductive type which is formed on the semiconductor substrate of the first conductive type, and includes a drain connected to the second power source terminal and a source connected to the load terminal; a first power supply detection circuit for detecting that the first power supply is connected to the first power source terminal, and delivering a detection signal; a control circuit for delivering, upon receiving the detection signal, a control signal to a gate of the first MOS transistor and a gate of the second MOS transistor; a step-up circuit for stepping up one of a voltage of the first power supply and a voltage of the second power supply, to deliver a stepped-up voltage; a first level shifter which is disposed between the control circuit and the gate of the first MOS transistor and performs a level shift operation on the control signal to the stepped-up voltage; and a second level shifter which is disposed between the control circuit and the gate of the second MOS transistor and performs a level shift operation on the control signal to the stepped-up voltage.

According to the power supply switching circuit of the present invention, in the case of the first conductive type semiconductor substrate, the second conductive type MOS transistor is disposed as a switch circuit between the load and one of the first power supply and the second power supply. Therefore, no parasitic diode exists between the load and one of the first power supply and the second power supply, whereby there exists no current path due to the parasitic diode.

Therefore, the power supply switching circuit of the present invention can supply the load effectively with a desired voltage among a plurality of voltages.

DETAILED DESCRIPTION OF THE PREFERRED EMBODIMENTS

Hereinafter, with reference to the attached drawings, embodiments of the present invention are described.

First Embodiment

Figure 1:
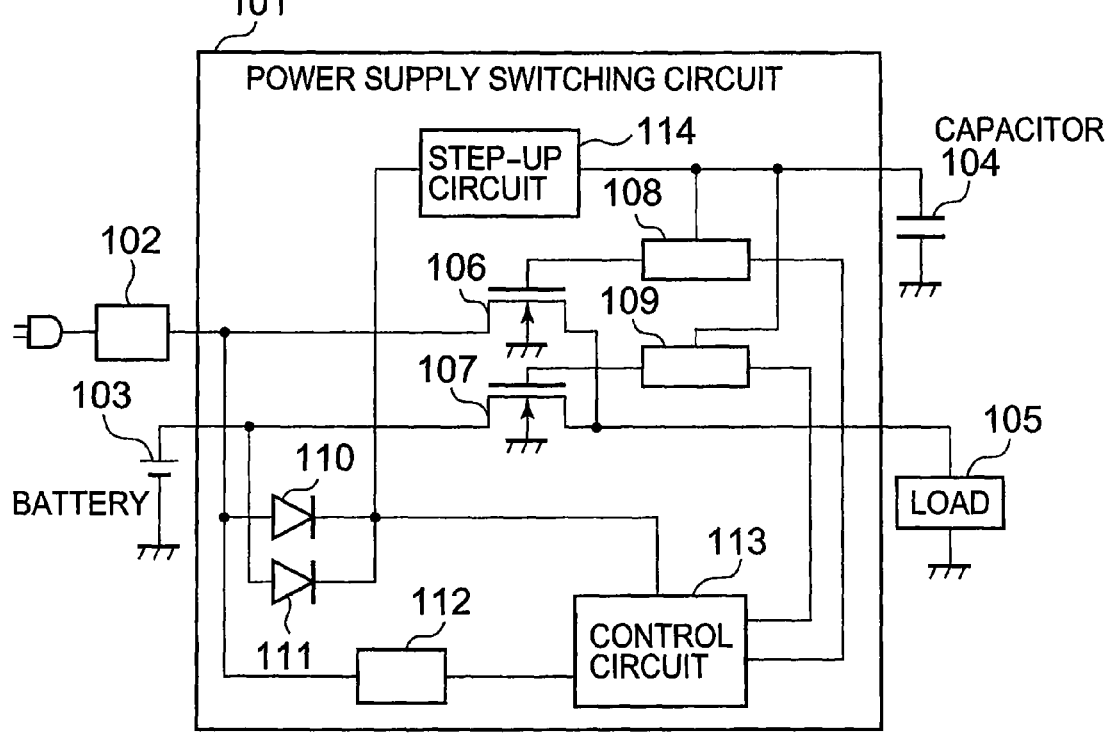
FIG. 1 is a diagram illustrating a power supply switching circuit according to a first embodiment of the present invention.

In the first place, a structure of a power supply switching circuit according to a first embodiment of the present invention is described. FIG. 1 is a diagram illustrating the power supply switching circuit of the first embodiment of the present invention.

Here, a power supply switching circuit 101 is formed on a semiconductor substrate of P type as a first conductive type.

The power supply switching circuit 101 includes N-type MOS transistors 106 and 107, level shifters 108 and 109, diodes 110 and 111, an AC adapter detection circuit 112, a control circuit 113, and a step-up circuit 114. The power supply switching circuit 101 is connected to an AC adapter 102, a battery 103, a capacitor 104, and a load 105, for example, as a peripheral circuit.

A first power source terminal for connecting to the AC adapter 102 is connected to a drain of the N-type MOS transistor 106, an anode of the diode 110 and an input terminal of the AC adapter detection circuit 112. A second power source terminal for connecting to the battery 103 is connected to a drain of the N-type MOS transistor 107 and an anode of the diode 111. A gate of the N-type MOS transistor 106 is connected to an output terminal of the level shifter 108, and a source thereof is connected to a load terminal. A gate of the N-type MOS transistor 107 is connected to an output terminal of the level shifter 109, and a source thereof is connected to the load terminal for connecting to the load 105. An output terminal of the AC adapter detection circuit 112 is connected to a first input terminal of the control circuit 113. Each of cathodes of the diodes 110 and 111 is connected to an input terminal of the step-up circuit 114 and a power source terminal of the control circuit 113. An output terminal of the step-up circuit 114 is connected to the capacitor 104. A power source terminal of the level shifter 108 is connected to an output terminal of the step-up circuit 114, and an input terminal thereof is connected to a first output terminal of the control circuit 113. A power source terminal of the level shifter 109 is connected to the output terminal of the step-up circuit 114, and an input terminal thereof is connected to a second output terminal of the control circuit 113.

Next, an operation of the power supply switching circuit of the first embodiment is described.

<The case where the AC adapter 102 and the battery 103 are connected to the power supply switching circuit 101>

When the AC adapter detection circuit 112 detects that the AC adapter 102 is connected to the power supply switching circuit 101, the AC adapter detection circuit 112 delivers a detection signal to the control circuit 113. Then, the control circuit 113 delivers a high level signal to the level shifter 108 and delivers a low level signal to the level shifter 109. The level shifter 108 performs a level shift operation on the high level signal based on a stepped-up voltage and charges accumulated in the capacitor 104, and delivers the level-shifted high level signal to the gate of the N-type MOS transistor 106. Therefore, the N-type MOS transistor 106 is turned on, whereby a voltage of the AC adapter 102 is supplied to the load 105. The level shifter 109 delivers the low level signal to the gate of the N-type MOS transistor 107. Therefore, the N-type MOS transistor 107 is turned off, and hence a voltage of the battery 103 is not supplied to the load 105.

A higher voltage between the voltage of the AC adapter 102 and the voltage of the battery 103 is supplied to the step-up circuit 114 via the diode 110 or the diode 111. Here, a current due to the supplied voltage does not flow into the AC adapter 102 or the battery 103 because of the diode 110 or the diode 111. The step-up circuit 114 performs a step up operation based on the supplied voltage, and delivers the stepped-up voltage to the level shifters 108 and 109. In addition, the step-up circuit 114 delivers the stepped-up voltage to the capacitor 104, whereby the charges are accumulated in the capacitor 104.

<The case where only the battery 103 is connected to the power supply switching circuit 101>

When the AC adapter detection circuit 112 detects that the AC adapter 102 is not being connected to the power supply switching circuit 101, the AC adapter detection circuit 112 delivers a detection signal to the control circuit 113. Then, the control circuit 113 delivers the low level signal to the level shifter 108 and delivers the high level signal to the level shifter 109. The level shifter 108 delivers the low level signal to the gate of the N-type MOS transistor 106. Therefore, the N-type MOS transistor 106 is turned off. The level shifter 109 performs the level shift operation on the high level signal based on the stepped-up voltage and the charges accumulated in the capacitor 104, and delivers the level-shifted high level signal to the gate of the N-type MOS transistor 107. Therefore, the N-type MOS transistor 107 is turned on, whereby the voltage of the battery 103 is supplied to the load 105.

The voltage of the battery 103 is supplied to the step-up circuit 114 via the diode 111. Here, a current due to the supplied voltage does not flow into the first power source terminal because of the diode 110. The step-up circuit 114 performs the step up operation based on the supplied voltage, so that the stepped-up voltage is delivered to the level shifters 108 to 109. In addition, the step-up circuit 114 delivers the stepped-up voltage to the capacitor 104, whereby the charges are accumulated in the capacitor 104.

Here, the control circuit 113 is designed to have a delay time after the N-type MOS transistor 106 is turned off until the N-type MOS transistor 107 is turned on, and a delay time after the N-type MOS transistor 107 turned off until the N-type MOS transistor 106 is turned on. Therefore, the N-type MOS transistors 106 and 107 are not turned on at the same time, and hence the AC adapter 102 and the battery 103 are not short-circuited, whereby the AC adapter 102 does not charge the battery 103, for instance. In addition, the step-up circuit 114 stops the step up operation when the stepped-up voltage becomes a predetermined voltage, and hence a power loss is decreased.

In addition, the level-shifted high level signal in the level shifter 108 and the N-type MOS transistor 106 has a voltage higher than a voltage determined by adding a threshold voltage of the N-type MOS transistor 106 to the voltage of the AC adapter 102. Therefore, the gate voltage of the N-type MOS transistor 106 corresponds to the level-shifted high level signal, and hence a voltage between the gate and the source of the N-type MOS transistor 106 is secured even when the N-type MOS transistor 106 is turned on so that the source voltage of the N-type MOS transistor 106 becomes substantially equal to the drain voltage thereof. Therefore, a voltage drop is hardly generated between the source and the drain of the N-type MOS transistor 106, and thus the voltage of the AC adapter 102 can be supplied to the load 105 with little voltage drop. Thus, the power loss is reduced. The same is true for the level shifter 109 and the N-type MOS transistor 107.

According to the power supply switching circuit of the first embodiment, in the case of the P-type semiconductor substrate, the N-type MOS transistor is disposed between the load 105 and the AC adapter 102 or the battery 103. Therefore, no parasitic diode exists between the load 105 and the AC adapter 102 or the battery 103, whereby there exists no current path due to the parasitic diode. Therefore, if the AC adapter 102 and the battery 103 are connected to the power supply switching circuit 101, the N-type MOS transistor 107 is turned off while the N-type MOS transistor 106 is turned on. Thus, only the AC adapter 102 can supply the voltage to the load 105.

In addition, there exists no current path due to a parasitic diode. Therefore, a parasitic bipolar transistor is prevented from being turned on by a current flowing in a parasitic diode, whereby a power loss due to the parasitic bipolar transistor can be reduced.

In addition, when the N-type MOS transistor 106 or the N-type MOS transistor 107 is turned on, even if a large parasitic capacitance exists in the gate of the N-type MOS transistor 106 or 107, the parasitic capacitance is charged by the charges accumulated in the capacitor 104. Therefore, the stepped-up voltage delivered from the step-up circuit 114 is hardly dropped due to the parasitic capacitance.

Note that the power supply switching circuit 101 may be formed on an N-type substrate and the N-type MOS transistors 106 and 107 may be replaced with P-type MOS transistors.

In addition, if drive capabilities of the N-type MOS transistors 106 and 107 increase, ON resistance values of the N-type MOS transistors 106 and 107 are decreased, with the result that the power losses in the N-type MOS transistors 106 and 107 are reduced.

In addition, the capacitor 104 may be disposed inside a semiconductor device on which the power supply switching circuit 101 is mounted or may be disposed outside the semiconductor device.

Second Embodiment

Next, a power supply switching circuit 101 according to a second embodiment of the present invention is described. Here, as a condition of a peripheral device, it is supposed that the load 105 includes a capacitor (not shown) for stabilizing power supply, and that the voltage of the AC adapter 102 is higher than the voltage of the battery 103.

Figure 2:
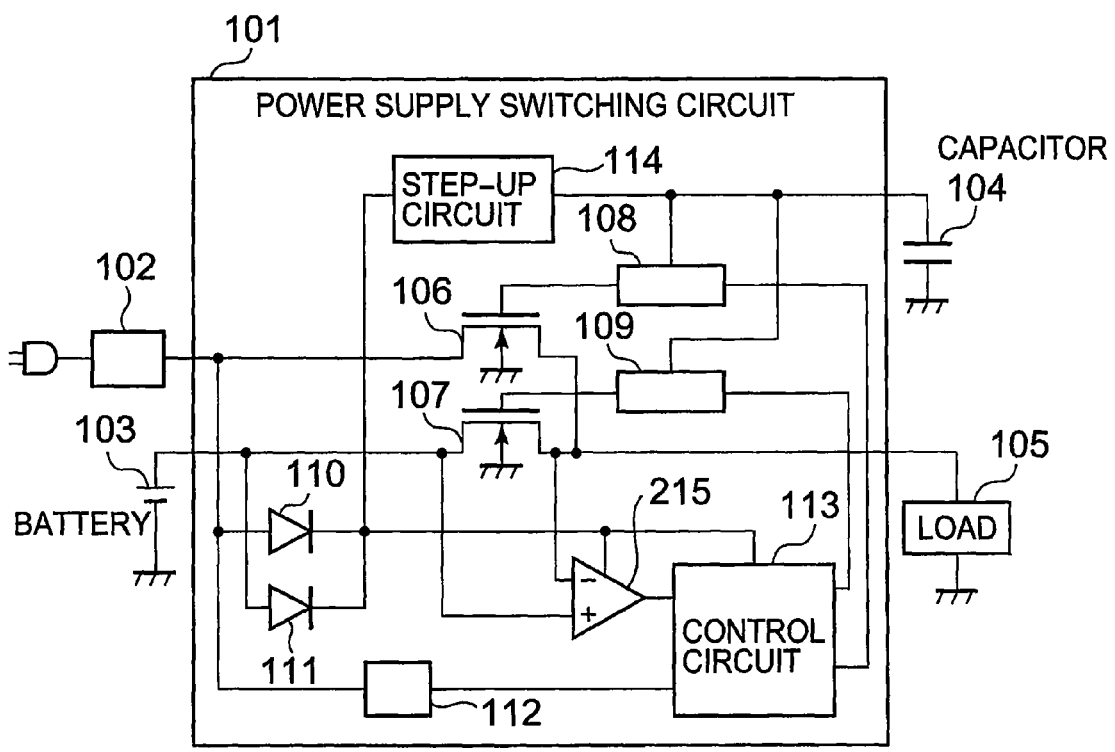
FIG. 2 is a diagram illustrating a power supply switching circuit according to a second embodiment of the present invention.

FIG. 2 is a diagram illustrating the power supply switching circuit of the second embodiment. The power supply switching circuit of the second embodiment includes a comparator 215 in addition to the power supply switching circuit of the first embodiment.

A power source terminal of the comparator 215 is connected to the cathodes of the diodes 110 and 111, a noninverting input terminal thereof is connected to the drain of the N-type MOS transistor 107, an inverting input terminal thereof is connected to the source of the N-type MOS transistor 107, and an output terminal thereof is connected to a second input terminal of the control circuit 113.

Next, an operation of the power supply switching circuit of the second embodiment is described.

<The case where only the battery 103 is connected to the power supply switching circuit 101>

The comparator 215 compares the voltage of the battery 103 (first power source terminal voltage) with a voltage to be supplied to the load 105 (load terminal voltage). Then, if the load terminal voltage is higher than or equal to the first power source terminal voltage, the comparator 215 controls the control circuit 113 to turn off the N-type MOS transistor 107. In addition, if the load terminal voltage is lower than the first power source terminal voltage, the comparator 215 controls the control circuit 113 to turn on the N-type MOS transistor 107.

Here, when the AC adapter 102 is detached from the power supply switching circuit 101, the voltage of the load 105 is the voltage of the AC adapter 102 due to the capacitor for stabilizing power supply. In other words, the voltage of the load 105 is higher than the voltage of the battery 103. On this occasion, according to the power supply switching circuit of the second embodiment described above, the comparator 215 controls the control circuit 113 to turn off the N-type MOS transistor 107. Therefore, a current does not flow back from the load 105 to the battery 103.

Third Embodiment

Figure 3:
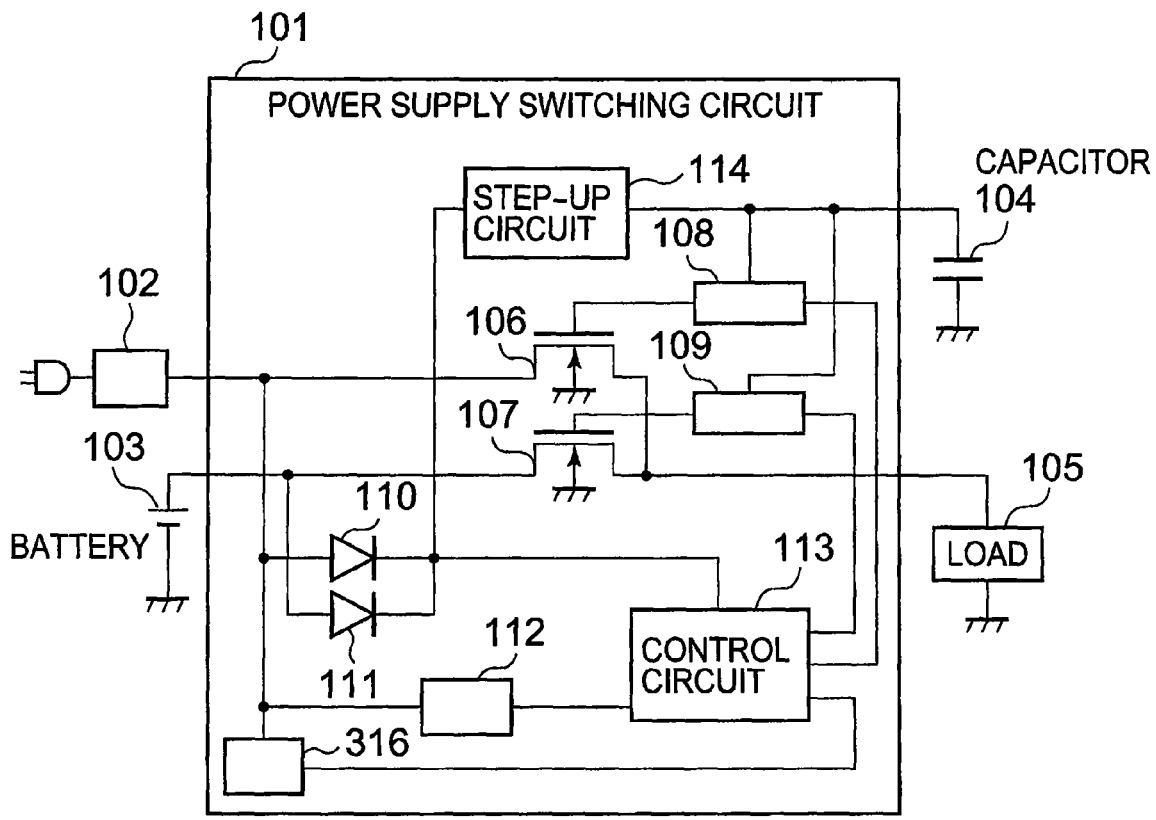
FIG. 3 is a diagram illustrating a power supply switching circuit according to a third embodiment of the present invention.
Figure 4:
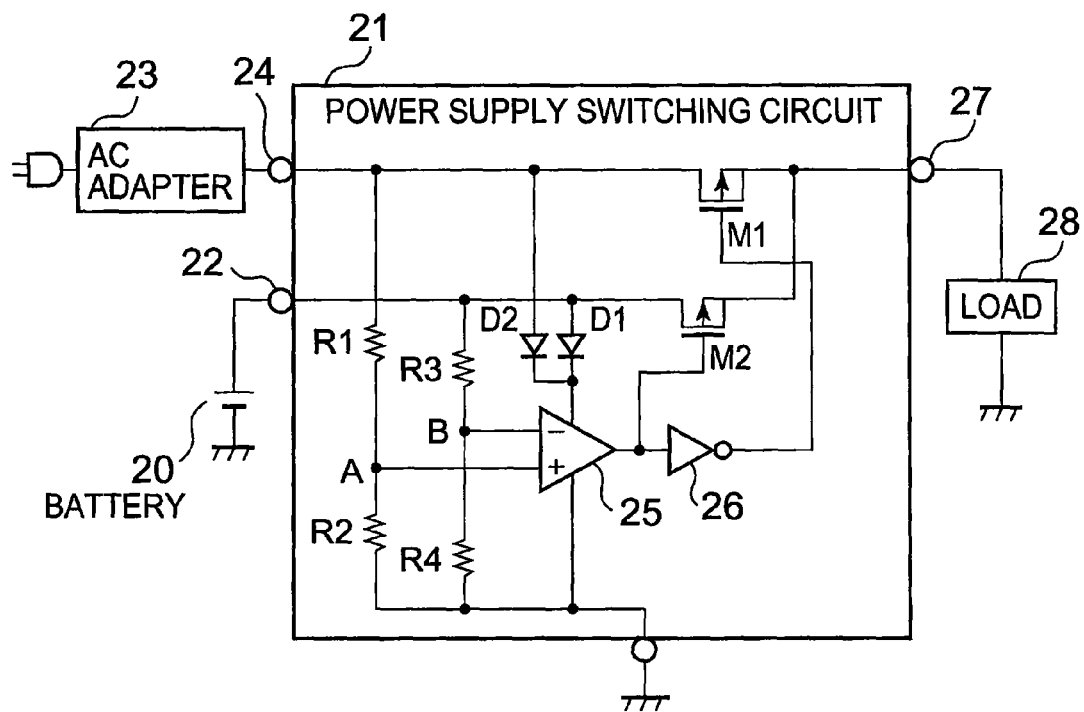
FIG. 4 is a diagram illustrating a conventional power supply switching circuit.

Next, a structure of a power supply switching circuit 101 according to a third embodiment of the present invention is described. FIG. 3 is a diagram illustrating the power supply switching circuit of the third embodiment.

The power supply switching circuit of the third embodiment includes a pull-down circuit 316 in addition to the power supply switching circuit of the first embodiment.

A power source terminal of the pull-down circuit 316 is connected to the first power source terminal to which the AC adapter 102 is connected, and an output terminal thereof is connected to a second input terminal of the control circuit 113.

Next, an operation of the power supply switching circuit of the third embodiment is described.

<The case where only the battery 103 is connected to the power supply switching circuit 101>

The first power source terminal for connecting to the AC adapter 102 is opened, and hence it is easily affected by noise or a leak current. Therefore, a detection error may occur in the AC adapter detection circuit 112.

However, according to the power supply switching circuit of the third embodiment, even if noise or a leak current occurs at the first power source terminal, the AC adapter detection circuit 112 can operate stably without a detection error because the first power source terminal is pulled down to a ground potential via the pull-down circuit 316.

Note that even if the AC adapter 102 is connected to the power supply switching circuit 101, a discharge capability of the pull-down circuit 316 is sufficiently lower than a power supply capability of the AC adapter 102. Therefore, the voltage of the AC adapter 102 is sufficiently supplied to the load 105.

In addition, it is possible to adopt a structure in which the pull-down circuit 316 is provided with a switch circuit so that the pull-down circuit 316 is connected to the power supply switching circuit 101 when the AC adapter 102 is detached therefrom. According to this structure, when the AC adapter 102 is connected to the power supply switching circuit 101, the pull-down circuit 316 is disconnected, whereby a power loss due to the pull-down circuit 316 can be eliminated.

What is claimed is:

1. A power supply switching circuit, comprising:
a first power source terminal to which a first power supply is connected;
a second power source terminal to which a second power supply is connected;
a first MOS transistor of a second conductive type which is formed on a semiconductor substrate of a first conductive type, and includes a drain connected to the first power source terminal and a source connected to a load terminal;
a second MOS transistor of the second conductive type which is formed on the semiconductor substrate of the first conductive type, and includes a drain connected to the second power source terminal and a source connected to the load terminal;
a first power supply detection circuit for detecting that the first power supply is connected to the first power source terminal, and delivering a detection signal;
a control circuit for delivering, upon receiving the detection signal, a control signal to a gate of the first MOS transistor and a gate of the second MOS transistor;
a step-up circuit for stepping up one of a voltage of the first power supply and a voltage of the second power supply, to deliver a stepped-up voltage;
a first level shifter which is disposed between the control circuit and the gate of the first MOS transistor and performs a level shift operation on the control signal to the stepped-up voltage; and
a second level shifter which is disposed between the control circuit and the gate of the second MOS transistor and performs a level shift operation on the control signal to the stepped-up voltage.

2. A power supply switching circuit according to claim 1, further comprising:
a first rectifier element including an anode connected to the first power source terminal and a cathode connected to an input terminal of the step-up circuit; and a second rectifier element including an anode connected to the second power source terminal and a cathode connected to the input terminal of the step-up circuit, wherein the step-up circuit steps up higher one of the voltage of the first power supply and the voltage of the second power supply.

3. A power supply switching circuit according to claim 1, further comprising a comparator for comparing a voltage of the second power source terminal with a voltage of the load terminal, wherein the comparator detects that the voltage of the load terminal becomes lower than the voltage of the second power source terminal and delivers a signal for turning on the second MOS transistor to the control circuit.

4. A power supply switching circuit according to claim 1, further comprising a pull-down circuit for pulling down the first power source terminal.

* * * * *